United States Patent
Katayama

(10) Patent No.: US 6,308,244 B1
(45) Date of Patent: Oct. 23, 2001

(54) INFORMATION PROCESSING APPARATUS WITH IMPROVED MULTIPLE MEMORY ACCESS AND CONTROL

(75) Inventor: Masatoshi Katayama, Amagasaki (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/202,105

(22) Filed: Feb. 25, 1994

(30) Foreign Application Priority Data

Feb. 26, 1993 (JP) .................................................... 5-037203

(51) Int. Cl.⁷ ...................................................... G06F 12/02
(52) U.S. Cl. ......................... 711/148; 711/163; 711/168; 710/7; 365/230.03
(58) Field of Search .................................. 710/4, 7, 9, 13, 710/26, 102; 711/2, 5, 100, 115, 148, 153, 173, 202, 211, 163, 168; 714/218, 911; 365/189.01, 230.03, 230.06

(56) References Cited

U.S. PATENT DOCUMENTS

| | | | |
|---|---|---|---|
| 4,394,728 | * | 7/1983 | Comfort et al. ...................... 395/731 |
| 4,630,197 | * | 12/1986 | Khera ................................... 395/490 |
| 4,747,047 | * | 5/1988 | Coogan et al. ...................... 395/858 |
| 4,905,182 | * | 2/1990 | Fitch et al. .......................... 395/282 |
| 4,982,378 | * | 1/1991 | Matsushita ....................... 365/189.01 |
| 5,056,060 | * | 10/1991 | Fitch et al. .......................... 395/823 |
| 5,150,328 | * | 9/1992 | Aichelmannk, Jr. ............. 365/189.03 |
| 5,276,831 | * | 1/1994 | Nakanishi et al. ................... 395/166 |
| 5,276,900 | * | 1/1994 | Schwede .............................. 395/800 |
| 5,339,402 | * | 8/1994 | Ueda .................................. 395/421.1 |
| 5,386,517 | * | 1/1995 | Sheth et al. .......................... 395/880 |
| 5,398,324 | * | 3/1995 | Matida et al. ....................... 395/842 |
| 5,430,859 | * | 7/1995 | Norman et al. ...................... 395/430 |
| 5,502,822 | * | 3/1996 | Takebe ................................. 395/310 |

FOREIGN PATENT DOCUMENTS

| | | |
|---|---|---|
| 5922297 | 2/1984 | (JP) . |
| 62169244 | 7/1987 | (JP) . |
| 62182953 | 8/1987 | (JP) . |
| 1169557 | 7/1989 | (JP) . |
| 1259438 | 10/1989 | (JP) . |
| 2199562 | 8/1990 | (JP) . |
| 2216573 | 8/1990 | (JP) . |
| 3134712 | 6/1991 | (JP) . |
| 3138750 | 6/1991 | (JP) . |
| 3144739 | 6/1991 | (JP) . |

OTHER PUBLICATIONS

Neal Margulis, "Design A Dram Memory Bank For The 80386", Electronic Design, Jan. 26, 1989, pp. 113–119.

* cited by examiner

Primary Examiner—Hiep T. Nguyen
(74) Attorney, Agent, or Firm—Rothwell, Figg, Ernst & Manbeck

(57) ABSTRACT

An information processing apparatus includes a central processing unit; a first and a second memory; a single CPU bus to which said first memory and said second memory are connected for transferring a memory address and a writing/reading control signal which are output from said central processing unit; means for controlling writing/reading to said first memory and said second memory, for decoding said memory address and said writing/reading control signal to make both of said first memory and said second memory in a state enabling writing or make only one of said first memory and said second memory in a state enabling reading.

The same information is written into the duplex memories at the same time and the information can be read out independently from respective memories. A single CPU bus is sufficient for multiple memories, and duplex writing and individual reading are performed in a small quantity of hardware.

10 Claims, 10 Drawing Sheets

INFORMATION PROCESSING APPARATUS WITH IMPROVED MULTIPLE MEMORY ACCESS AND CONTROL

FIELD OF THE INVENTION

The present invention relates to an information processing apparatus including duplex systems. More particularly, this invention relates to an improvement in the writing/reading system of the duplex memory system, an improvement in the duplex memory control system in the duplex CPU card system, and further an improvement in the multi processor system including a plurality of CPUs and a plurality of memories which are connected with each other via a CPU bus.

BACKGROUND OF THE INVENTION

FIG. 10 is a diagram illustrating a prior art memory control system disclosed in Japanese Published Patent Application Hei.1-169557. In the figure, reference numerals 101a~101d designate CPUs which perform operation processing or the like according to a prescribed procedure described as a program. Reference numerals 104 and 105 designate memories storing data or the like which are processed by the CPUs 101a~101d. Reference numeral 102 designates a memory controller controlling the memories 104 and 105. Reference numeral 103 designates a duplex writing device provided in the memory controller 102 to control the duplex writing.

This apparatus includes sixteen clusters, i.e., cluster 0~cluster 15, and each cluster includes four CPUs and two memories owned jointly.

A description is given of the operation. When an instruction ordered by a CPU instructs duplex writing for writing the same information into two memories at the same time, one of the CPU 101a~101d outputs a request for duplex writing to the duplex writing device 103 in the memory controller 102. When the duplex writing device 103 receives the duplex writing request signal, it produced a designated writing address for the memory device 104 as well as a corresponding duplex writing address for the other memory 105, and sends writing requests to the memories 104 and 105 at the same time. Accordingly, the information to be stored in the memory device can be stored in the two memories by one time writing operation.

FIG. 11 is a diagram for explaining a prior art system for controlling data transfer to a duplex memory system disclosed in Japanese Published Patent Application Hei. 3-144739. In the figure, reference numerals 201 and 204 designate CPUs performing operation processing or the like according to a prescribed procedure described as a program. Reference numerals 202 and 205 designate memories storing data or the like which are processed by the CPUs 201 and 204. Reference numerals 203 and 209 designate inter-system information transfer device for transferring information between two systems of CPU partitioned by one dot chain line in the figure. Reference numeral 206 designates a data bus for communicating data through the CPU 201, the memory 202, and the inter-system information transfer device 203. Reference numeral 207 designates a data bus for communicating data through the CPU 204, the memory 205, and the inter-system information transfer device 209. Reference numeral 208 designates an inter-system information transmitting circuit in the inter-system information transfer device 203. Reference numeral 212 designates an inter-system data bus communicating data between the inter-system information transfer devices 203 and 209. Reference numeral 210 designates a buffer circuit into which data sent out from the inter-system information transmitting circuit 208 through the inter-system data bus 212 is written. Reference numeral 211 designates a writing information transmitting circuit for writing information from the CPU 201 in an active state system (hereinafter referred to as ACT system) to the memory 205 of the CPU 204 in an non-active state system (hereinafter referred to as STBY system). Reference numeral 213 designates a data comparing circuit for comparing the data read out from the ACT system with information read out from the STBY system.

A description is given of the operation.

When a data writing access to the ACT system memory 202 is generated from the ACT system central processing unit 201, a memory address, data to be written in, and a writing signal are communicated to the memory 202 via the data bus 206, and also communicated to the inter-system information transfer device 203 and are latched inside the inter-system information transmitting circuit 208. These signals are also communicated to the STBY system inter-system information transfer device 209 via the inter-system data bus 212 and are written in into the buffer circuit 210 synchronized with ACT system clocks. These signals are read out from the buffer circuit 210 independently from the operation of the ACT system data bus but synchronized with the STBY system clocks, and are sent out to the data bus 207 via the writing information transmitting circuit 211 to be written in into the STBY system memory 205.

When a data reading access to the ACT system memory 202 is generated from the ACT system central processing unit 201, a memory address and a reading signal are transferred to the memory 202 via the data bus 206, also communicated to the inter-system information transfer device 203, and they are latched inside the inter-system information transmitting circuit 208. The memory 202 communicates the data that is read out from the memory address received, of the memory to the central processing unit 201 via the data bus 206 as well as communicates the same to the inter-system information transfer device 203, and they are latched inside the inter-system information transmitting circuit 208. These signals are also communicated to the inter-system information transfer device 209 via the inter-system data bus 212, and are written into the buffer circuit 210 synchronized with ACT system clocks. These signals are read out from the buffer circuit 210 independent on the operation of the ACT system data bus but synchronized with STBY system clocks, the read out data are latched inside the data comparing circuit 213. The memory address and the read out signal are output to the data bus 207 via the data comparing circuit 213 and are input to the memory 205. Because the access is reading out access, the read out data from the memory 205 in the STBY system are output to the data bus 207, and are latched inside the data comparing circuit 213. The ACT system read out data and the STBY system read out data are compared by the data comparing circuit 213, and when there is incoincidence, an interrupting notice is output to the ACT system CPU.

FIG. 12 is a diagram illustrating a prior art multi-processor system. In the figure, reference numerals 301a and 301b designate central processing units which perform operation processing or the like in accordance with a pre-scribed procedure described as a program. Reference numerals 302a and 302b designate memories storing data or the like processed by the CPU 301a and 301b, respectively. Reference numeral 303 designates a CPU bus connecting the CPU 301a and 301b via the bus gates 305a and 305b. Reference numeral 304 designates a bus arbiter for arbitrating the occupation of the CPU bus 303 by performing open/close control of the bus gates 305a and 305b. Reference numerals 305a and 305b designate bus gates which transmit or do not transmit the I/O (input/output) data of the CPUs 301a and 301b, respectively to the CPU bus 303. Reference numerals 306a and 306b designate address decoders for decoding the output data of the CPUs 301a and 301b, respectively, and transmitting those to the bus arbiter 304. Reference numerals 307a and 307b designate memory access request signals which are output from the address decoders 306a and 306b, respectively. Reference numeral 308a and 308b designate bus gate control signals which are output from the bus arbiter 304.

A description is given of the operation.

When the CPU 301a accesses the memory 302a or 302b, the CPU 301a outputs an address for the memory 302a or 302b. The address decoder 306a decodes the address and outputs a memory access request signal 307a to the bus arbiter 304. Then, the bus arbiter 304 allows the CPU 301a to access a memory and outputs a bus gate control signal 308a unless the other CPU 301b is in access to the memory 302a or 302b, i.e., unless the address decoder 306b is outputting a memory access request signal 307b to the bus arbiter 304, whereby the bus gate 305a is opened to make the CPU bus 303 opened to the CPU 301a. To the contrary, when the CPU 301b has already accessed the memory 302a or 302b, the bus arbiter 304 does not allow the CPU 301a to access a memory and outputs the bus gate control signal 308a after the access by the CPU 301b is completed.

The memory control system in the prior art information processing apparatus is performed as described above, and the duplex writing device has to produce a duplex writing address also for the other memory, corresponding to the writing address of the designated memory. Further, CPU buses of the same number as that of the memories are required, increasing the hardware quantity.

In the data transfer control system for transferring data to the duplex memory in the prior art information processing apparatus described above, the memory content read out from the STBY system memory is only used when it is compared with the memory content of the ACT system memory that is temporarily stored in the buffer circuit, and it is impossible for the ACT system CPU to arbitrarily read out the memory content of the STBY system memory. In addition, because the data transfer control system uses a buffer, the memory writing in the other system takes a longer time than that in the self system, and the identity of the memory content is not secured during the delayed time between the two systems, thereby causing a malfunction.

Further, in the multi processor system in the prior art information processing apparatus constructed described above, while one side CPU is in access to a memory, the other side CPU is obliged to wait for an access unconditionally, whereby processing ability per unit time is reduced.

SUMMARY OF THE INVENTION

It is an object of the present invention to provide an information processing apparatus that includes a plurality of memories connected via a single CPU bus, only requiring a small quantity of hardware for performing duplex writing, and that can arbitrarily read out the content of the individual memory.

It is another object of the present invention to provide an information processing apparatus that secures the identity of the memory content of the two systems.

It is a still another object of the present invention to provide an information processing apparatus in a multi processor that can minimize reduction in the processing ability per unit time.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an information processing apparatus in a processor system having CPUs and memories, includes duplex memories connected to a single CPU bus. The same information is written into the duplex memories at the same time and the information can be read out independently from respective memories. A single CPU bus is sufficient for multiple memories, and duplex writing and individual reading are performed in a small quantity of hardware.

According to a second aspect of the present invention, an information processing apparatus employs a memory map of a CPU devised so that the accesses to memories, i.e., the selection of duplex memories at writing and the selection of one of respective memories at reading, are performed by a chip select circuit instructing the simultaneous writing of duplex memories and the individual reading of respective memories in accordance with which address region the address that is output from the CPU belongs to. Therefore, there is no necessity of generating a duplex writing address for the other memory corresponding to a designated writing address for the designated memory, whereby duplex writing and individual reading are performed in a small quantity of hardware.

According to a third aspect of the present invention, the accesses to respective memories are performed by a bank select signal. The selection of the duplex memories at writing and the selection of one of respective memories at reading are performed with a chip selecting system, and the chip selecting circuit indicates the simultaneous writing of the duplex memory or the individual reading of respective memories by the writing/reading means, whereby the memory region is fully utilized for performing the duplex-writing and the individual reading.

According to a fourth aspect of the present invention, in a system in which CPU cards, each including a CPU and a memory, are duplex, when information is written into a memory of a card, that information is also written into the other card, and the memory content of the first card and the memory content of the other card are respectively read out by different addresses. When writing is performed into the first card, writing is also performed into the other card, and the reading of the memory content in the self system card and that of the memory content in the other system card are also accomplished by different addresses, whereby the memory contents of the self system card and the other system card can be mutually known by the other side system card.

According to a fifth aspect of the present invention, a plurality of CPU cards are mutually connected with each other via a bus gate. The memory is divided into two areas, one corresponding to duplex writing or self system reading and one corresponding to the other system reading, and a chip select generating part generates a memory writing signal or a memory reading signal from the result of decoding the memory address and the writing signal. Thus, the selection of duplex memories at writing and the selection of individual memories at reading are performed in accordance with the chip selecting signal. The control of the chip selecting generating part and the bus gate is performed by a gate control circuit in accordance with a writing signal or a reading signal that is output from the CPU of respective cards. Therefore, it is possible to know the memory content of the other system, and it is also possible to perform the simultaneous writing of the same data into the self system memory and into the other system memory, whereby the identity of the memory contents is secured.

According to a sixth aspect of the present invention, a plurality of CPU cards are connected with each other via a bus gate. The memory is divided into three areas, i.e., one corresponding to duplex writing, one corresponding to self system reading, and one corresponding to the other system reading, and a chip select generating part generates a memory writing signal and a memory reading signal from the result of decoding the memory address. Thus, the selection of duplex memories at writing and the selection of individual memories at reading are performed in accordance with the chip selecting signal. The control of the chip selecting generating part and the bus gate is performed by a gate control circuit in accordance with a writing signal or a reading signal that is output from the CPU of respective cards. Therefore, it is possible to know the memory content of the other system, and it is also possible to perform the simultaneous writing of the same data into the self system memory and into the other system memory, whereby the identity of the memory contents is secured and further the hardware is simplified to some extent.

According to a seventh aspect of the present invention, in a multi-processor system in which a plurality of CPUs and a plurality of memories are connected via a CPU bus, the simultaneous access by respective CPUs to different memories are allowed dependent on the combinations of the memories accessed by the respective CPUs. Therefore, reduction in the processing ability per unit time is largely suppressed.

According to an eighth aspect of the present invention, a bi-directional gate is provided at the center of the CPU bus, also there are provided two address decoders for decoding the address outputs from two CPUs and a bus arbiter performing open/close control of two bus gates and the bi-directional gate in accordance with the decoder outputs of the address decoders. When different memories are accessed by two CPUs at the same time, the memories corresponding to the respective CPUs are separated from each other. Therefore, in a system including two CPUs and two memories, when one CPU is in access to the self system memory, the other CPU can access the other system memory at the same time.

According to a ninth aspect of the present invention, a bi-directional gate is provided between particular two memories connected to the CPU bus, and there are also provided two address decoders decoding addresses output from the two CPUs, and a bus arbiter performing an open/close control of the two bus gates and the bi-directional gate in accordance with the decoder outputs from the address decoders, so that when different memories are accessed by two CPUs at the same time, the memories are divided into two groups belonging to the respective CPUs. Therefore, when one CPU is in access to a particular memory, the other side CPU can access memories closer to that memory at the same time.

DETAILED DESCRIPTION OF THE PREFERRED EMBODIMENT

Embodiment 1

Figure 1:
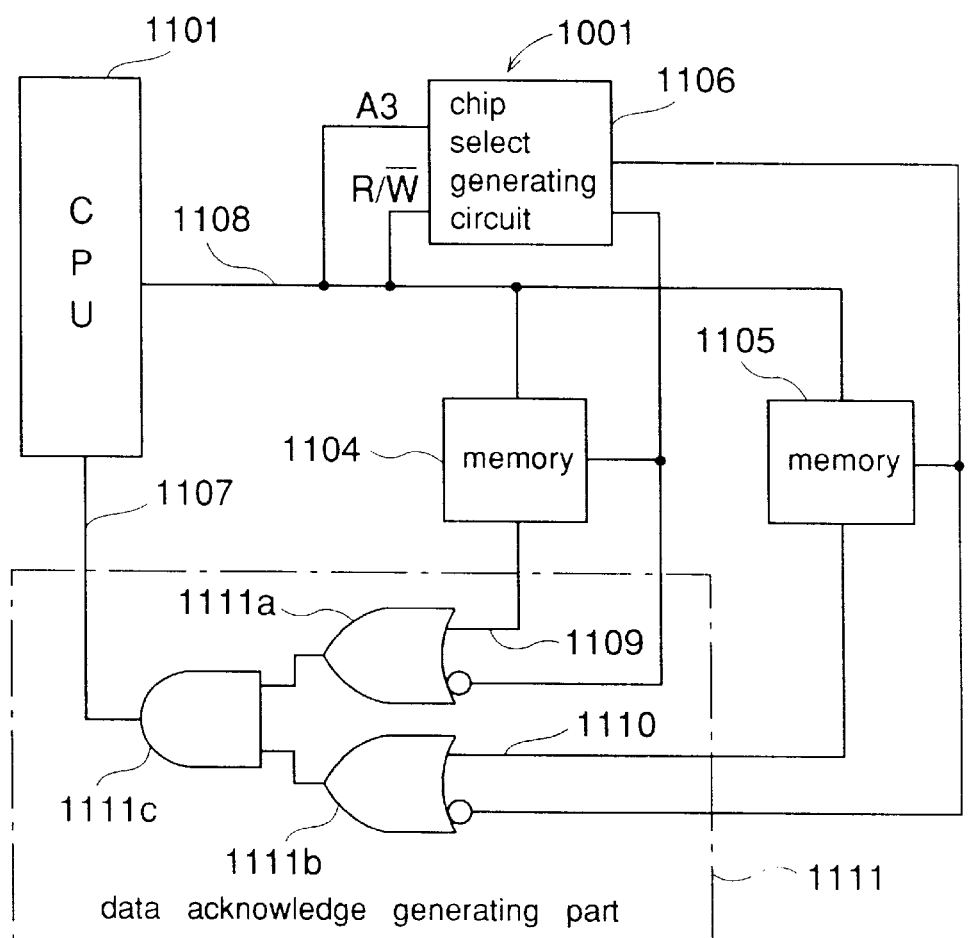
FIG. 1 is a diagram illustrating a memory duplex system in an information processing apparatus according to a first embodiment of the present invention.

FIG. 1 illustrates an information processing apparatus according to a first embodiment of the present invention. This embodiment is designed so as to eliminate the hardware quantity when memory is in duplex in order to enhance the reliability. In the figure, reference numeral 1101 designates a CPU for performing operation processing in accordance with a prescribed procedure described in a program. Reference numerals 1104 and 1105 designate duplex memories provided for the CPU 1101. Numeral 1106 designates a chip select generating circuit for outputting a chip selecting signal which makes the memories 1104 and 1105 active. The writing/reading control means 1001 which enables simultaneous writing of the same signal into the duplex memories 1104, 1105 as well as enables reading of the same information from the respective memories functions as this chip select generating circuit 1001. Reference numeral 1108 designates a CPU bus for communicating data between the CPU 1101 and the memories 1104, 1105 and between the CPU 1101 and the chip select generating circuit 1106. Numerals 1109, 1110 designate access completing signals which are output from the memories 1104, 1105 when the accesses are completed. Numeral 1111 designates a data acknowledge generating part which outputs a data acknowledge signal 1107 when the memory 1104, 1105 (or both), which is activated by the chip select generating circuit 1106, outputs the access completing signal 1109, 1110 (or both). In the data acknowledge signal generating part 1111, reference numeral 1111*a* designates a two input OR gate to which the access completing signal 1109 from the memory 1104 is input in a positive phase and the chip select signal from the chip select generating circuit 1106 is input in a reverse phase. Numeral 1111b designates a two input OR gate to which the access completing signal 1110 from the memory 1105 is input in a positive phase and the chip select signal from the chip select generating circuit 1106 is input in a reverse phase. Numeral 1111c designates a two input AND gate to which the outputs of the two input OR gates 1111a and 1111b are input and outputs a data acknowledge signal 1107.

Figure 2:
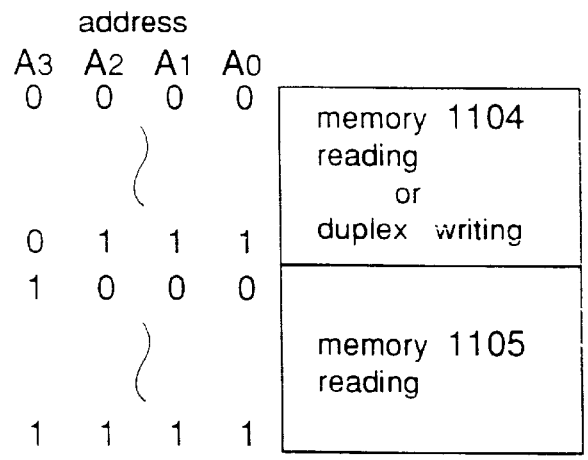
FIG. 2 is a diagram showing a memory map in a CPU corresponding to FIG. 1.

FIG. 2 shows a memory map in the CPU 1101 in a case of four bit address, in this first embodiment. In this case, the region of address 0000~0111 represent reading or duplex-writing of the memory 1104, and the region of address 1000~1111 represent reading of the memory 1105.

A description is given of the operation. When the CPU 1101 performs duplex writing of the same data into the memories 1104, 1105, it outputs the duplicate writing address (the address having an MSB (most significant bit) of "0" in FIG. 1) and a writing signal. The chip select generating circuit 1106 decodes these signals and outputs a chip selecting signal to the both memories. The memories 1104, 1105 receive this chip selecting signal and write data that is to be written into the memory address which is received from the CPU bus 1108, and outputs access completing signals 1109, 1110. The data acknowledge generating part 1111 outputs the data acknowledge signal 1107 only when these signals are both output. In this way, writing the same data into the both memories is performed by one-time writing operation, i.e., simultaneous writing is achieved.

Next, when the CPU 1101 reads out the content of the memory 1104, the CPU 1101 outputs the reading address of the memory 1104 (in FIG. 1, the address including an MSB of "0"), and also a reading signal. The chip select generating circuit 1106 decodes these signals and outputs a chip selecting signal only to the memory 1104. The memory 1104 informs, in response to the chip selecting signal, a reading address corresponding to the memory address that is received from the CPU bus 1108 to the CPU 1101, transmitting the same on the CPU bus 1108 and also outputs an access completing signal 1109. The other memory 1105 performs no operation because it does not receive the chip selecting signal. The data acknowledge generating part 1111 outputs the data acknowledge signal 1107 in response to the access completing signal 1109, whereby the content of the memory 1104 is allowed to be read out.

Next, when the CPU 1101 reads out the content of the memory 1105, it outputs a reading address of the memory 1105 (in FIG. 1, the address including an MSB of "1"), and a reading signal. The chip select generating circuit 1106 decodes these signals and outputs a chip selecting signal only to the memory 1105. Thereafter, the operation is performed similarly as the reading operation of the memory 1104 and only the content of the memory 1105 is read out.

According to this first embodiment of the present invention, a plurality of memories are connected to a single CPU bus, and the memories are selected for reading or writing with a chip selecting system. That is, the memory map of the memories is devised so that whether that memory is for reading or not is determined in accordance with whether the MSB of the reading address is "0" or "1", and that the duplex writing is immediately performed when the MSB of the writing address is "0". Therefore, there is no necessity of generating an address for duplex writing into the other memory, which corresponds to the designated writing address of the designated memory. Further, not a plurality of CPU buses of the same number as that of the memories, but only one CPU bus is required, requiring less quantity of hardware for performing duplex-writing.

While in the above-described first embodiment the memory map is divided into two regions, the memory map can be divided into three regions, i.e., one for duplicate-writing, one for the memory 1104 reading, and one for the memory 1105 reading, with the same effects as described above obtained.

Embodiment 2

While in the above-described first embodiment the reading address for the both memories are divided into two regions, an I/O port circuit may be provided to provide a bank switching system in place of the chip selecting system. In this case, while an instruction for switching a bank is required, the memory space can be utilized effectively and sufficiently.

Figure 3:
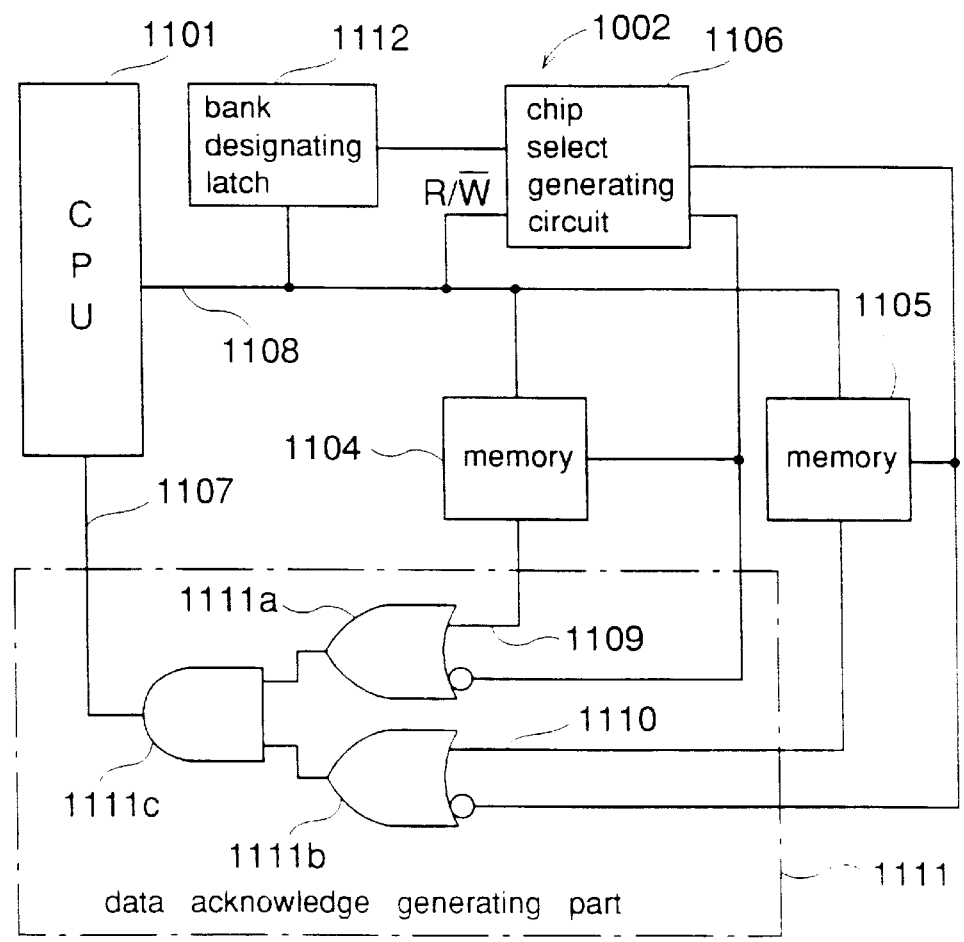
FIG. 3 is a diagram illustrating a memory duplex system in an information processing apparatus according to a second embodiment of the present invention.

A second embodiment of the present invention will be described in the following. In FIG. 3, reference numeral 1101 designates a CPU which performs operation processing according to a prescribed procedure described in a program. Reference numerals 1104, 1105 designate duplex memories for the CPU 1101, and reference numeral 1106 designates a chip select generating circuit which outputs a chip selecting signal for activating the memories 1104, 1105. Reference numeral 1108 designates a CPU bus for communicating data between the CPU 1101 and the memories 1104, 1105 and between the CPU 1101 and the chip select generating circuit 1106. Numerals 1109, 1110 designate access completing signals which are output from the memories 1104, 1105 when the accesses are completed. Numeral 1111 designates a data acknowledge generating part which outputs a data acknowledge signal 1107 when the memory 1104, 1105 (or both) which is activated by the chip select generating circuit 1106, outputs the access completing signal 1109, 1110,(or both). Reference numeral 1112 designates a bank designating latch for bank switching the all address regions of the memories 1104, 1105. Reference numeral 1002 designates writing/reading control means comprising the bank designating latch 1112 and the chip select generating circuit 1106.

Figure 4:
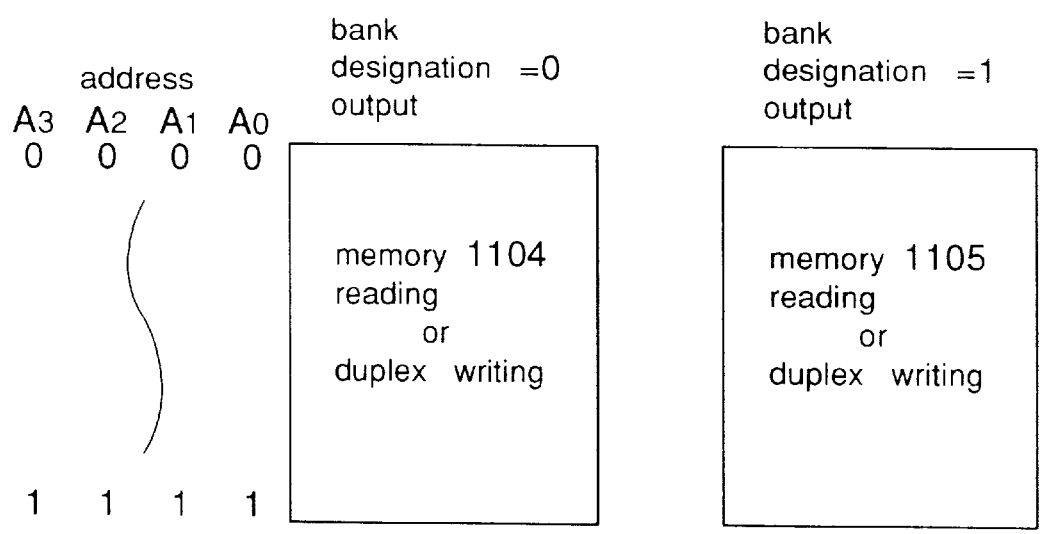
FIG. 4 is a diagram illustrating a memory map in a CPU corresponding to FIG. 3.

FIG. 4 shows a memory map in the CPU 1101 in a case of four bit address, in this embodiment of the present invention. When the bank designating signal is "0", all regions of address 0000~1111 represent reading or duplicate writing for the memory 1104, and when the bank designating signal is "1", all regions of address 0000~1111 1111 represent reading or duplicate writing for the memory 1105.

A description is given of the operation. When the CPU 1101 reads out the content of the memory 1104, it performs reading access after writing data "0" into the bank designating latch 1112. The chip select generating part 1106 outputs a chip selecting signal 1109 to the memory 1104 on the basis of the output of the bank designating latch 1112 being "0" and that the access is a reading access, and the operation thereafter is similarly performed as in the first embodiment. In other words, the memory 1104 receives the chip selecting signal and, in response thereto, it communicates the read out data from the memory address corresponding to the address that is received from the CPU bus 1108, transmitting the same data on the CPU bus 1108, and informs the same to the CPU 1101. Then, it also outputs the access completing signal 1109. The memory 1105 does not receive a chip select signal and performs no operation. The data acknowledge generating part 1111 outputs the data acknowledge signal 1107 upon receipt of the access completing signal 1109, whereby the content of the memory 1104 is allowed to be read out.

On the other hand, when the CPU 1101 reads out the content of the memory 1105, first of all, data "1" is written into the bank designating latch 1112, and then reading access is performed. The chip select generating circuit 1106 outputs the chip selecting signal 1110 to the memory 1105 because the output of the bank designating latch 1112 is "1" and also because the access is a reading address and, thereafter the similar operation as in the first embodiment is performed.

When the CPU 1101 performs the duplex writing, there is no necessity of writing particular data to the bank designating latch 1112, and even when any of "0" or "1" is written into the bank designating latch 1112, the chip select generating circuit 1106 outputs a chip selecting signal to the both memories 1104, 1105 because the access is a writing access regardless of the output of the bank designating latch 1112 and, thereafter the similar operation is performed as in the first embodiment. That is, the memories 1104, 1105 receive the chip selecting signal and writes the writing data into the memory address that is received from the CPU bus 1108, and outputs the access completing signals 1109, 1110. The data acknowledge generating part 1111 outputs the data acknowledge signal 1107 for the first time when these both signals are output, whereby it is possible to write the same data into the both memories by one time writing operation.

The above-described construction is particularly effective in a case where the memory 1104 is employed in an usual operation and the memory 1105 is employed in place of the memory 1104 when an obstruct ion occurs.

As described above, in this second embodiment, an I/O port is added in the first embodiment to employ a bank switching system, and by outputting an instruction for switching a bank, it is possible to perform duplicate writing and individual reading utilizing effectively and sufficiently the memory space.

Embodiment 3

Figure 5:
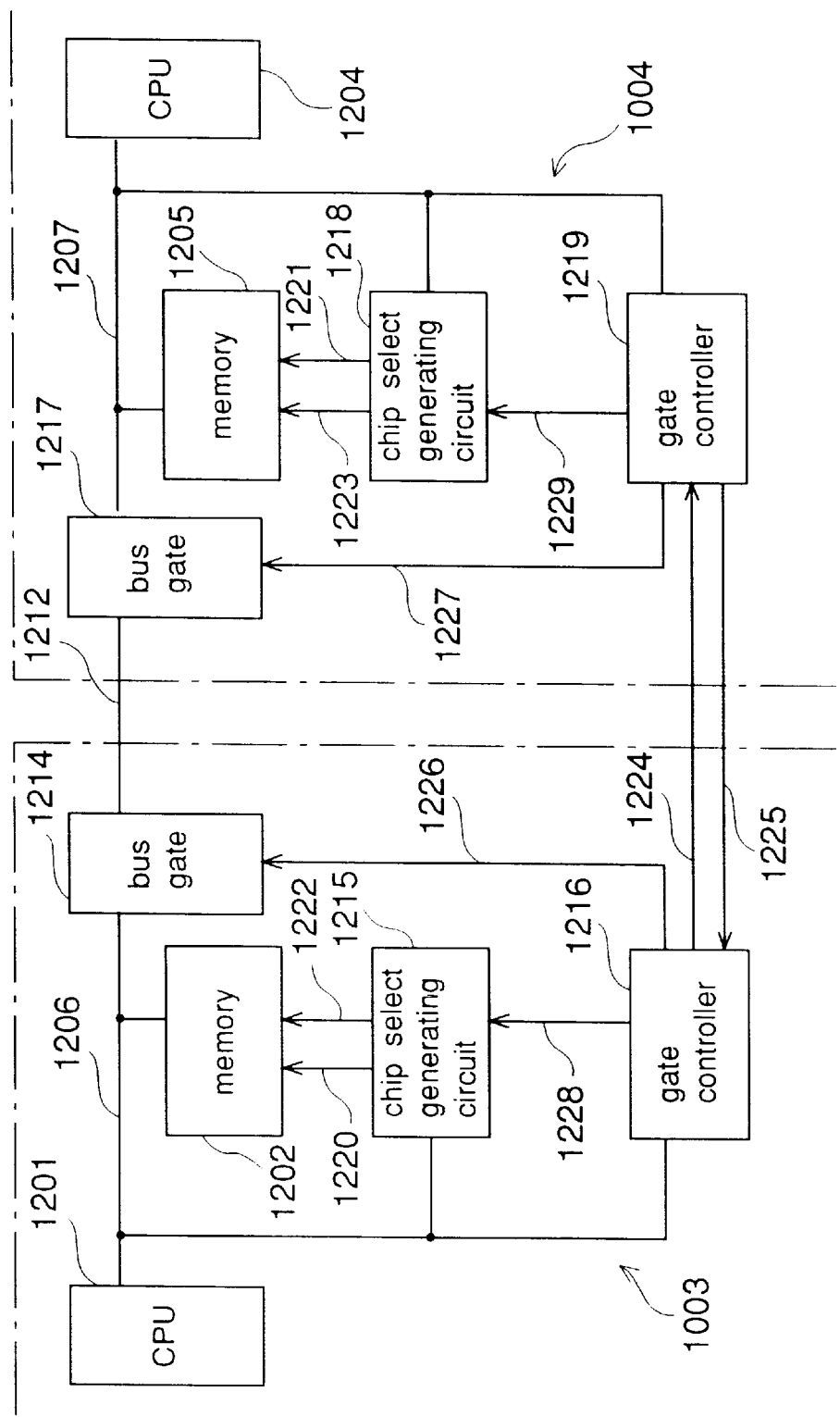
FIG. 5 is a diagram illustrating a duplex control system of a memory in an information processing apparatus according to a third embodiment of the present invention.

FIG. 5 shows an information processing apparatus according to a third embodiment of the present invention. This embodiment performs individual reading of the memory content freely for the self system and for the other system. In the figure, respective portions sectioned by one point chain lines represent CPU cards, respectively. This CPU card provides a CPU system mounting a CPU and memories or the like on a printed circuit board. In the respective CPU card system, reference numerals 1201, 1204 designate CPUs each performing operation processing in accordance with a prescribed procedure described in a program. Reference numerals 1202 and 1205 designate memories included in these two CPUs 1201, 1204, respectively. Numerals 1206, 1207 designate data buses connecting the CPU 1201, 1204 and the memories 1202, 1205, respectively. Reference numeral 1212 designates an inter-system data bus connecting the system including the CPU 1201 and the system including the CPU 1204. Reference numerals 1214, 1217 designate bus gates connecting or disconnecting the inter-system data bus 1212 and the data bus 1206, 1207, respectively. Reference numerals 1215, 1218 designate chip select generating circuits, respectively, for generating chip selecting signals activating the memories 1202, 1205, respectively. Reference numerals 1216, 1219 designate gate controller for controlling the open/close of the bus gates 1214, 1217, respectively. Reference numeral 1003 designates writing/reading means, comprising the chip select generating circuit 1215 and the gate controller 1216, for writing the same information securely into the other side CPU card when it writes information into the memory in one side CPU card, and thereby it enables reading the memory content in the self system card and that in the other system card by separate addresses independently. Reference numeral 1004 designates writing /reading means comprising the chip select generating circuit 1218 and the gate control part 1219 for writing the same information surely to the other system CPU card when it writes information into the memory in the self system CPU card, whereby the reading of the memory content in the self system card and the reading of the memory consent in the other system card can be performed by separate addresses independently. Reference numerals 1220, 1221 designate memory writing signals which are output from the chip select generating circuits 1215, 1218 to the memories 1202, 1225, respectively. Reference numerals 1222, 1223 designate memory reading signals which are output from the chip select generating circuits 1215, 1218 to the memories 1202, 1205, respectively. Reference numerals 1224, 1225 designate other system access signals which are output from the gate controllers 1216, 1219 to the other side gate controllers 1219, 1216, respectively. Reference numerals 1226, 1227 designate bus gate control signals which are output from the gate controllers 1216, 1219 to the bus gates 1214, 1217, respectively. Reference numerals 1228, 1229 designate other system access communicating signals which are output from the gate controllers 1216, 1219 to the chip select generating circuits 1215, 1218, respectively.

Figure 6:
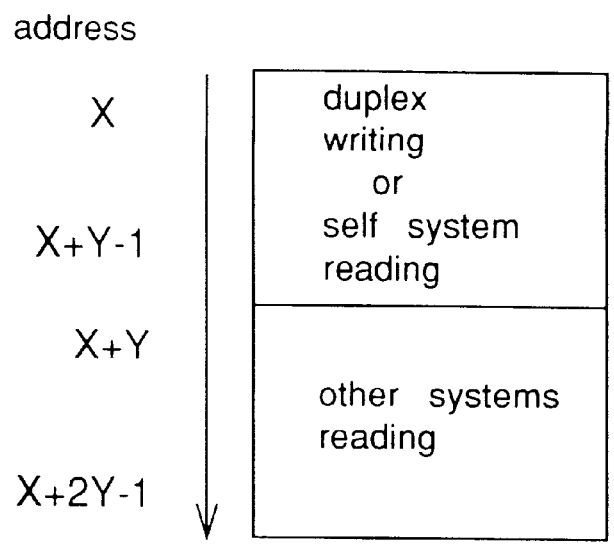
FIG. 6 is a diagram illustrating a construction of a memory map according to a third embodiment of the present invention.

FIG. 6 shows a memory map in each system memory in this third embodiment. To the address region from X to X+Y−1, duplicate writing and self system reading are assigned, while to the address region from X+Y to X+2Y−1, the other system reading is assigned. In other words, the memory map is divided into two areas, i.e., the area for duplicate writing and self system reading, and the area for the other system reading.

A description is given of the operation.

The memory map of CPU in each system is designed as shown in FIG. 6. When one side system CPU (for example, CPU 1204 of STBY system) generates an address indicating data writing to the self system memory 1205 on a memory map, the memory address and the writing signal are input to the chip select generating circuit 1218 and the gate controller 1219 via the data bus 1207. The chip select generating circuit 1218 decodes these signals and outputs the memory writing signal 1221. The memory address and the writing data are input to the memory 1205 via the data bus 1207 from the CPU 1204, and the writing is performed by these and the memory writing signal 1221. At the same time, the gate controller 1219 decodes these signals, and outputs the other system access signal 1225 as well as closes the bus gate 1217 by outputting the gate control signal 1227. The gate controller 1216 of the other system, i.e., ACT system, receives the other system access signal 1225 from the gate controller 1219, and outputs the gate signal 1226 to close the bus gate 1214 on an assumption that the CPU 1201 does not access the memory 1202, whereby the memory address writing data and writing signal which are output from the CPU 1204 are input to the chip select generating circuit 1215 via the data bus 1207, the bus gate 1217, the inter-system data bus 1212, the bus gate 1214, and the data bus 1206. The chip select generating circuit 1215 thereby generates the memory writing signal 1220, and performs writing of the same data as that which is written into the memory 1205 into the memory 1202. In this way, the duplex writing into the memory is performed.

Next, when the CPU 1204 intends to know the content of the self system memory 1205, it outputs an address in an address region to which the self-system reading is assigned on the memory map of FIG. 6, whereby the memory address and the reading out signal are input to the chip select signal generating circuit 1218 and the gate controller 1219 via the data bus 1207. First of all, the chip select generating circuit 1218 decodes these signals and outputs the memory reading signal 1223 and the memory 1205 informs, in response to the memory address that is input via the data bus 1207 and the memory reading out signal 1223, the read out data to the CPU 1204, transferring the same on the data bus 1207. Then, the gate controller 1219 similarly performs decoding, but it judges that it is the self system reading and, therefore it outputs no signal.

On the other hand, when the CPU 1204 intends to know the content of the other system memory 1202, it outputs an address in an address region to which the other system reading out is assigned on a memory map of FIG. 6, whereby the memory address and the reading signal are input via the data bus 1207 to the chip select generating circuit 1218 and the gate controller 1219. First of all, the chip select generating circuit 1218 decodes these signals, as a result it recognizes that it is the other system reading, and it outputs no signal. Then, the gate controller 1219 similarly decodes the same and outputs the other system access signal 1225 to the gate controller 1216 as well as outputs the gate control signal 1227 to close the bus gate 1217. The other system gate controller 1216 receives the other system access signal, and outputs the gate control signal 1226 to close the bus gate 1214 on an assumption that the CPU 1201 does not access the memory 1202, and further outputs the other system access communicating signal 1228 to the chip select generating circuit 1215. The memory address and the reading signal output from the CPU 1204 are input to the chip select generating circuit 1215 via the data bus 1207, the bus gate 1217, the inter-system data bus 1212, the bus gate 1214, and the data bus 1206. The chip select generating circuit 1215 outputs the memory reading signal 1222 in response to these signals and the other system access communicating signal 1228 from the gate controller 1216, and the memory 1202 informs the read out data to the CPU 1204, transferring the same on the data bus 1206 via the bus gate 1214, the inter-system data bus 1212, the bus gate 1217, and the data bus 1207.

As described above, according to this third embodiment, the memory map is devised and divided into an address region for performing the duplicate-writing or the self system reading and an address region for performing the other system reading, and the open/close control of the bus gate connecting or disconnecting the inter-system data bus and the selection control of respective system memories, are carried out in response to the writing or reading signal and the address signal which are output from the CPU, whereby the reading of the memory content of the self system and the other system can be performed freely. Therefore, it is possible to recognize which of the duplex system occurred abnormality from performing sum checking or the like, so as to switch the duplicate system, thereby preventing occurrence of a system down. Further, because a memory to which writing or reading is to be performed is selected with a chip select system, the memory writing of the self system and the memory writing of the other system can be performed at the same time, i.e., the simultaneous writing is enabled, and the identity of the memory content is always secured.

Embodiment 4

Figure 7:
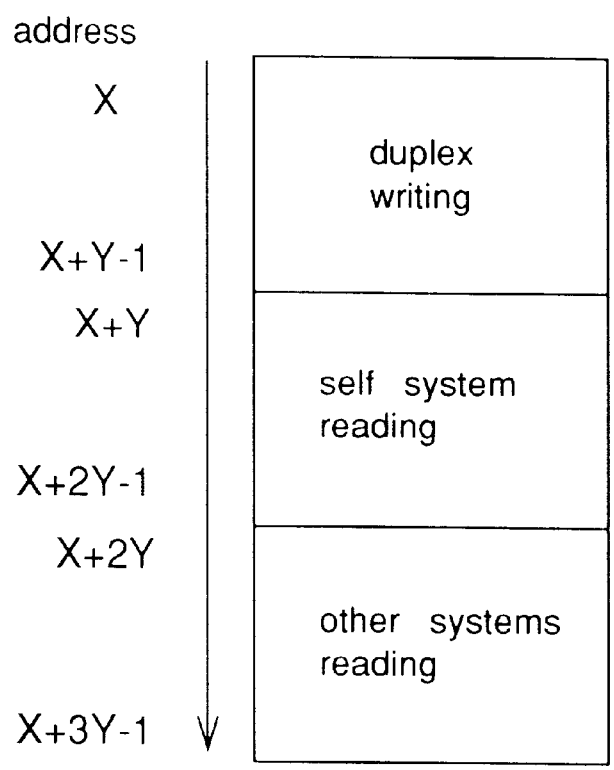
FIG. 7 is a diagram illustrating a construction of a memory map according to a fourth embodiment of the present invention.

In the above-described embodiment the address region for the duplex writing and the address region for the self-system reading are the same and they are distinguished by hardware from the writing signal and the reading signal on the data bus, but it is also possible to employ a memory map as shown in FIG. 7, in which the addresses for the duplicate writing and the addresses for the self-system reading are also separated from each other, realizing the system only by reading the address in view of hardware.

FIG. 7 shows a memory map of memories in respective systems according to a fourth embodiment of the present invention, in which the address region from X to X+Y−1 are for the duplicate writing, the address region from X+Y to X+2Y−1 are for the self-system reading, and the address region from X+2Y to X+3Y−1 are for the other system reading.

The block construction of the apparatus of this fourth embodiment is the same as that shown in FIG. 5, except that a signal which is supplied to the chip select generating circuit and the gate controller is only the address signal.

A description is given of the operation. The memory maps in the CPU of the respective systems are designed as shown in FIG. 7. When the one side CPU (for example, the CPU 1204 of the STBY system) generates an address indicating data writing into the memory 1205 of the self system on a memory map, the memory address is input to the chip select generating circuit 1218 and the gate controller 1219 via the data bus 1207. The chip select generating circuit 1218 decodes these signals and outputs a memory writing signal 1221. The memory address and the writing data are input to the memory 1205 via the data bus 1207 from the CPU 1204, and by these and the memory writing signal 1221, the writing is performed. At the same time, the gate controller 1219 decodes these signals and outputs the other system access signal 1225 as well as the gate control signal 1227 to close the bus gate 1217. The gate controller 1216 of the ACT system as the other system, receives the other system access signal 1225 from the gate controller 1219, and outputs the gate signal 1226 to close the bus gate 1214 on an assumption that the CPU 1201 is not in access to the memory 1202, whereby the memory address and the writing data output from the CPU 1204 are input to the chip select generating circuit 1215 via the data bus 1207, the bus gate 1217, the intersystem data bus 1212, the bus gate 1214, and the data bus 1206. The chip select generating circuit 1215 thereby generates a memory writing signal 1220, and writes the same data as that which is written into the memory 1205. Thus, the duplex writing into duplex memories is performed.

Next, when the CPU 1204 intends to know the content of the self-system memory 1205, it outputs an address in the address region for the self-system reading on the memory map of FIG. 7, whereby a memory address and a reading signal are output via the data bus 1207 to the chip select generating circuit 1218 and the gate controller 1219. First of all, the chip select generating circuit 1218 decodes these signals to output the memory reading signal 1223, and the memory 1205 which receives this signal 1223, outputs its memory content to the data bus 1207, in response to the memory address that is input via the date bus 1207, and informs to the CPU 1204. Then, the gate controller 1219 similarly performs decoding, and thereby it judges that it is the self-system reading and it outputs no signal.

On the other hand, when the CPU 1204 intends to know the content of the other system memory 1202, it outputs an address for the other system reading on the memory map of FIG. 7, whereby the memory address and the reading signal are input via the data bus 1207 to the chip select generating circuit 1218 and the gate controller 1219. First of all, the chip select generating circuit 1218 decodes these signals, and thereby it judges that it is the other system reading and it outputs no signal. Then, the gate controller 1219 similarly performs decoding and outputs the other system access signal 1225 to the gate controller 1216 as well as the gate control signal 1227 to close the bus gate 1217. The other system gate controller 1216 receives the other system access signal and outputs the gate control signal 1226 to close the bus gate 1214 on an assumption that the CPU 1201 is not in access to the memory 1202, and further outputs the other system access communication signal 1228 to the chip select generating circuit 1215. The memory address and the reading out signal which are output from the CPU 1204 and the reading signal are input to the chip select generating circuit 1215 via the data bus 1207, the bus gate 1217, the inter-system data bus 1212, the bus gate 1214, and the data bus 1206. The chip select generating circuit 1215 outputs the memory reading signal 1222 in response to these signals and the other system access communicating signal 1228 from the gate controller 1216, and the memory 1202 transfers the read out data on the data bus 1206, and informs the same to the CPU 1204 via the bus gate 1214, the inter-system data bus 1212, the bus gate 1217, and the data bus 1207.

As described above, according to this embodiment, the memory map is devised and divided into an address region for performing the duplex writing, an address region for performing a self-system reading, and an address region for performing the other system reading, and the open/close control of the bus gate connecting or disconnecting the inter-system data bus and the selection control of the memories of respective systems are preformed by the address signals output from the CPU, whereby the memory contents of the self system and the other system can be freely read out and the hardware is also simplified to some extent.

Embodiment 5

Figure 8:
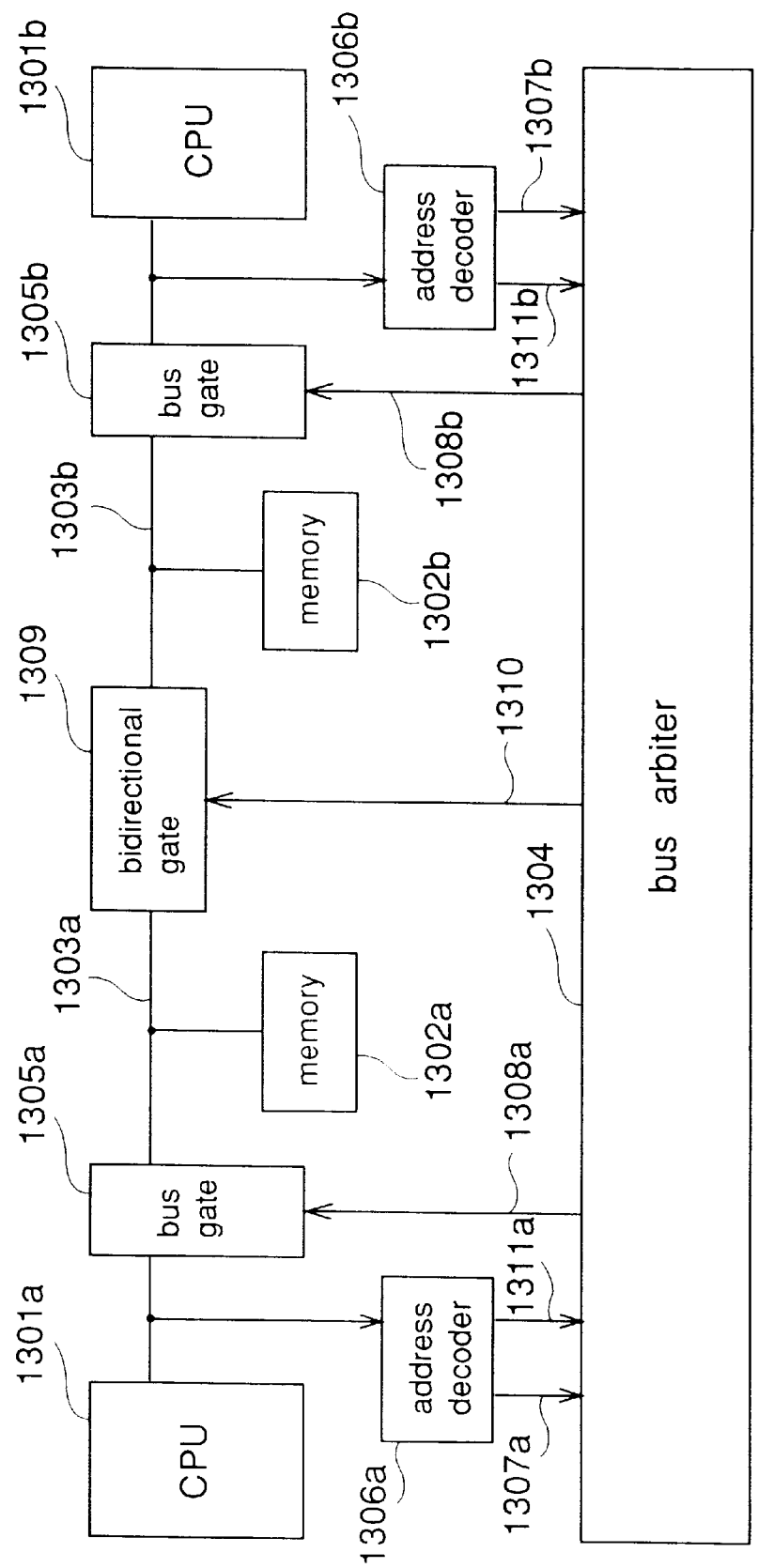
FIG. 8 is a diagram illustrating a multi-processor system in an information processing apparatus according to a fifth embodiment of the present invention.

A fifth embodiment will be described with reference to the drawings. FIG. 8 shows an information processing apparatus according to a fifth embodiment of the present invention. This embodiment enables that a plurality of CPUs perform the simultaneous access to the memories when a plurality of CPUs and a plurality of memories are connected to a single CPU bus. In the figure, reference numerals 1301a, 1301b designate CPUs performing operation processing according to a prescribed procedure described in a program, reference numerals 1302a, 1302b designate memories storing data processed by the CPUs 1301a 1301b, and reference numerals 1303a, 1303b designate CPU buses connecting the CPUs 1301a, 1301b via the bus gates 1305a, 1305b. Reference numerals 1305a, 1305b designate bus gates for transmitting the I/O data of the CPU units 1301a, 1301b to the CPU buses 1303a, 1303b when they are opened. Reference numerals 1306a, 1306b designate address decoders for decoding the output data of the CPUs 1301a, 1301b and transmitting the same to the bus arbiter 1304. Reference numeral 1309 designates a bi-directional gate connecting or disconnecting the CPU buses 1303a, 1303b. Reference numeral 1304 designates a bus arbiter for arbitrating the occupation of the CPU buses 1303a, 1303b by performing open/close control of the bus gates 1305a, 1305b and the bi-directional gate 1309. Reference numeral 1005 designates access control means which, comprising the bus arbiter 1304 and the address decoders 1306a, 1306b, allows the memories of respective CPUs to perform the simultaneous access depending on the combination of the memories accessed by respective CPUs. Further, reference numerals 1307a, 1307b designate memory access request signals, respectively, which are output by the address decoders 1306a, 1306b from decoding the output data of the CPUs 1301a, 1301b. Reference numerals 1308a, 1308b designate bus gate control signals which are output by the bus arbiter 1304. Reference numeral 1310 designates a bi-directional gate control signal which is output from the bus arbiter 1304. Reference numerals 1311a, 1311b designate memory number communicating signals output from the address decoders 1306a, 1306b, respectively.

A description is given of the operation. When the CPU 1301a accesses the memory 1302a, the address decoder 1306a outputs the memory access request signal 1307a to the bus arbiter 1304 as well as informs to the bus arbiter 1304 that the memory access request is performed by the memory number communication signal 1311a. The bus arbiter 1304 allows the CPU 1301a to perform an access of a memory by outputting a bus gate control signal 1308a to close the bus gate 1305a and not outputting the bi-directional bus gate control signal 1310 thereby keeping the bi-directional bus gate 1309 to be open when the other CPU 1301b is not in access to the memory 1302a, that is, when the address decoder 1306b does not output the memory access request signal 1307b to the bus arbiter 1304 or the CPU 1301b is in access to the memory 1302b. On the contrary, when the CPU 1301b is already in access to the memory 1302a, because the bi-directional bus gate control signal 1310 is output and the bi-directional gate 1309 is closed, the bus arbiter 1304 does not allow the CPU 1301a to access a memory and it allows the CPU 1301a to access a memory after the access of the CPU 1301b is completed.

The combination on which the both CPUs are allowed to perform a simultaneous access is a case where the CPU 1301a accesses the memory 1302a and the CPU 1301b accesses the memory 1302b as presented in the following table 1.

TABLE 1

|  |  | CPU 1a | |
|  |  | memory 2a | memory 2b |
| --- | --- | --- | --- |
| CPU 1b | memory 2a | only one side CPU is allowed to access | only one side CPU is allowed to access |
|  | memory 2b | both CPUs are allowed to access | only one side CPU is allowed to access |

As described above, according to this embodiment, in a case where two CPUs and two memories are connected to a single CPU bus, a bi-directional bus gate is provided at the center of the CPU bus so that the single CPU bus is separated into two parts. Therefore, when the CPU is in access to the self system memory, the other CPU can access the other system memory, and reduction in processing ability per unit time can be suppressed to a great extent.

Embodiment 6

While in the above-described fifth embodiment two memories are connected to the CPU buses 1303a, 1303b, an information processing apparatus of a similar construction can be provided also in a case where three or more memories are employed.

Figure 9:
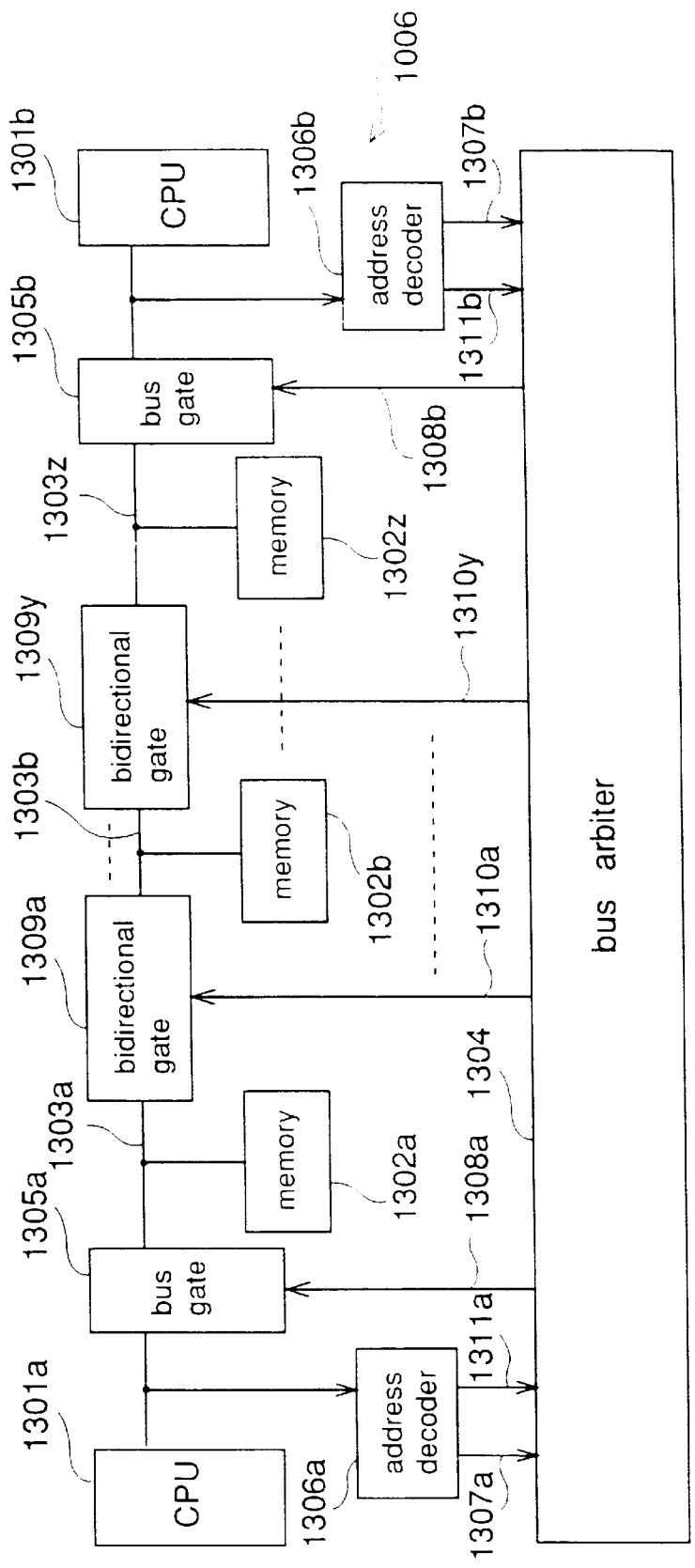
FIG. 9 is a diagram illustrating a multi-processor system in an information processing apparatus according to a sixth embodiment of the present invention.
Figure 10:
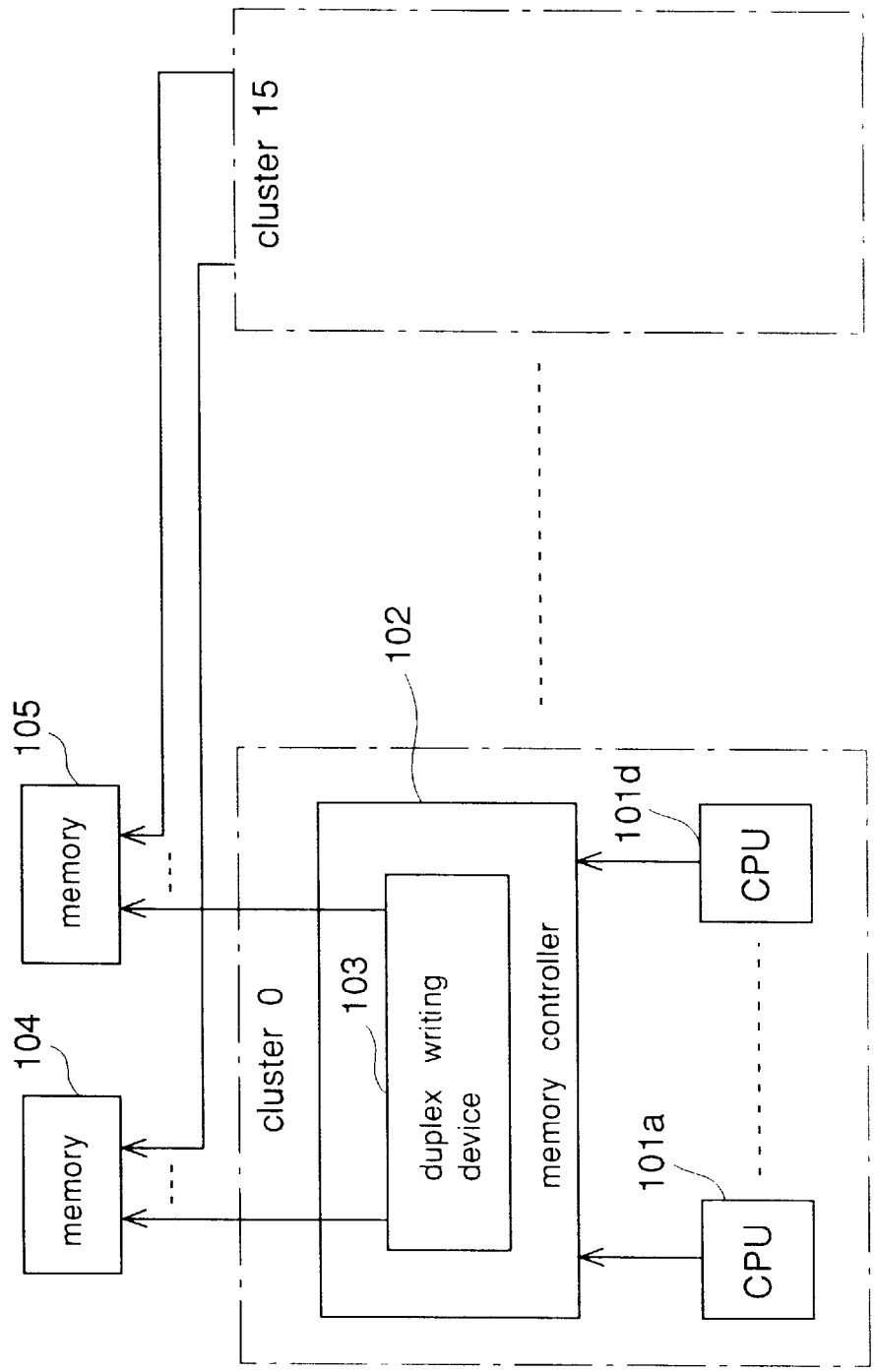
FIG. 10 is a diagram illustrating a memory control system according to a prior art information processing system.
Figure 11:
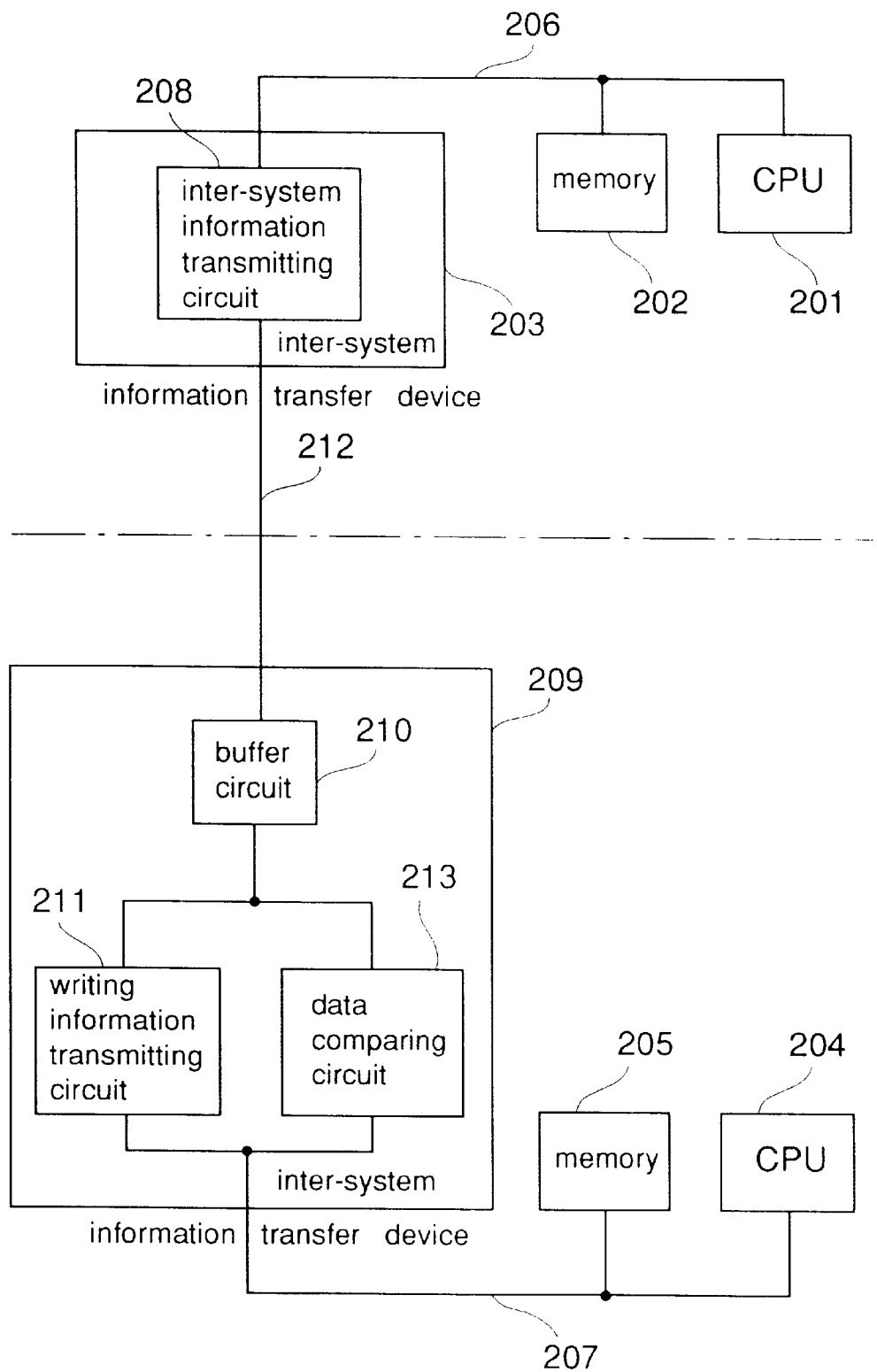
FIG. 11 is a diagram illustrating a data transfer control system for transferring data to the prior art duplex memory system.
Figure 12:
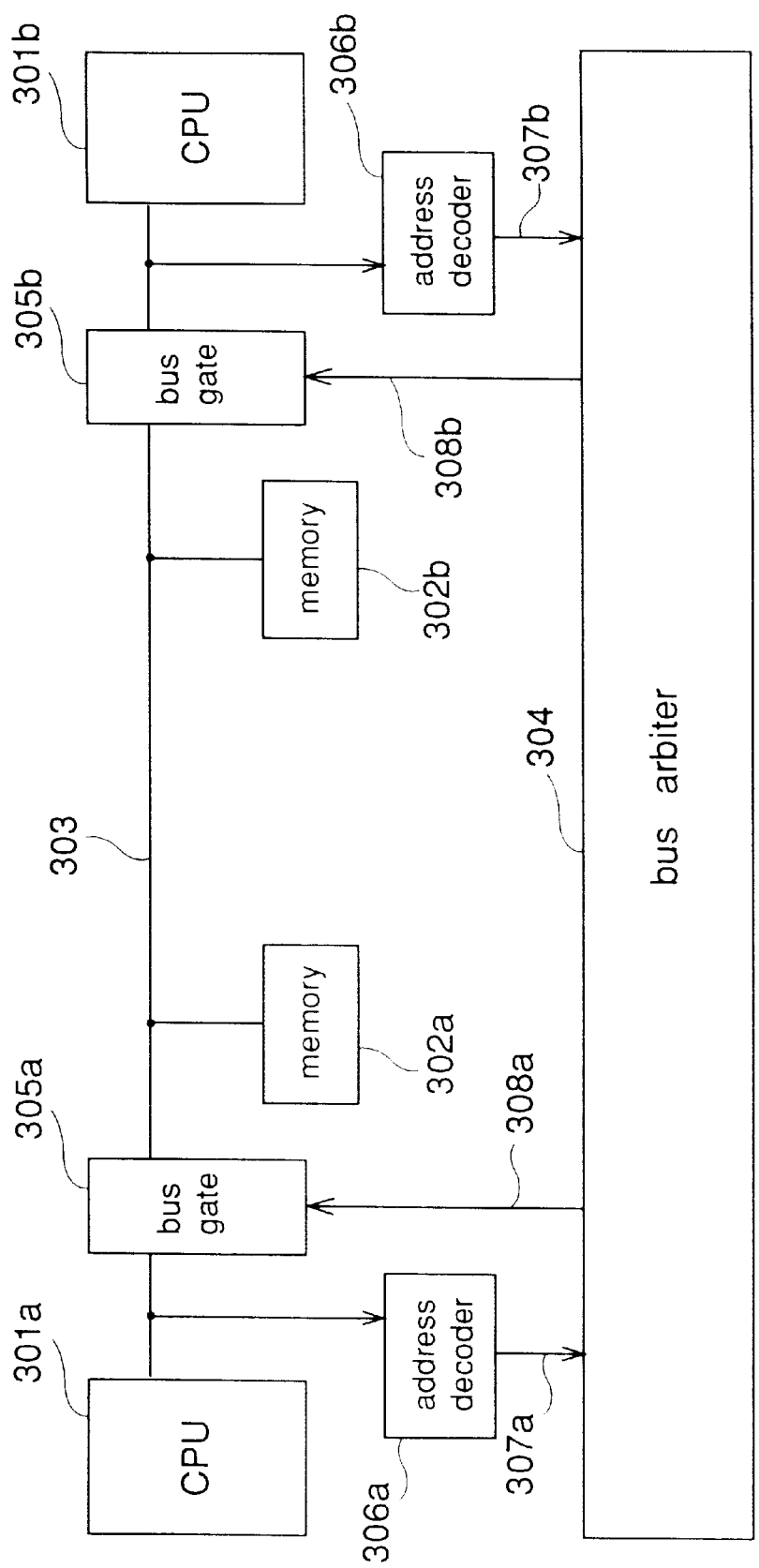
FIG. 12 is a diagram illustrating a prior art multi-processor system.

A description is given of a sixth embodiment of the present invention with reference to the drawings. In FIG. 9, reference numerals 1301a, 1301b designate CPUs performing operation processing according to a predetermined procedure described in a program. Reference numerals 1302a, 1302b, . . . , 1302z designate memories for storing data processed by the CPUs 1301a, 1301b. Reference numerals 1303a, 1303b, . . . , 1303z designate CPU buses for connecting CPUs 1301*a*, 1301*b* via the bus gates 1305*a*, 1305*b*. Reference numerals 1305*a*, 1305*b* designate bus gates for transferring the input/output data of the CPUs 1301*a*, 1301*b* to the CPU buses when they are opened. Reference numerals 1306*a*, 1306*b* designate address decoders for decoding the output data of the CPUs 1301*a*, 1301*b* and transmitting the decoded result to the bus arbiter 1304. Reference numerals 1309*a*, . . . , 1309*y* designate bi-directional gates connecting or disconnecting between adjacent CPU buses 1303*a*, 1303*b*, . . . , 1303*z*, respectively. Reference numeral 1304 designates a bus arbiter for arbitrating the occupation of the CPU bus 1303 by performing open/close control of the bi-directional gates 1309*a*, 1309*b*, . . . , 1309*y*. Reference numeral 1006 designates an access control means, comprising the bus arbiter 1304 and the address decoders 1306*a*, 1306*b*, for allowing the CPUs a simultaneous access to different memories dependent on the combination of the memories accessed by the respective CPUs. Reference numerals 1307*a*, 1307*b* designate memory access request signals which are output from the address decoders 1306*a*, 1306*b* by decoding the output data of the CPUs 1301*a*, 1301*b*, respectively. Reference numerals 1308*a*, 1308*b* designate bus gate control signals which are output from the bus arbiter 1304. Reference numerals 1310*a*, . . . , 1310*y* designate bi-directional gate control signals which are output from the bus arbiter 1304. Reference numerals 1311*a*, 1311*b* designate memory number communicating signals which are output from the address decoders 1306*a*, 1306*b*, respectively.

A description is given of the operation. When the CPU 1301*a* accesses the memory 1302*a*, the address decoder 1306*a* outputs a memory access request signal 1307*a* to the bus arbiter 1304 as well as informs that it is requesting an access to the memory 1302*a* by the memory number communicating signal 1311*a*. The bus arbiter 1304 allows the CPU 1301*a* to access a memory by outputting the bus gate control signal 1308*a* to close the bus gate 1305*a* and not outputting the bi-directional bus gate control signals 1310*a*, . . . , 1310*y* to keep the bi-directional bus gates 1309*a*, . . . , 1309*y* to be open when the other CPU 1301*b* is not in access to the memory 1302*a*, in other words, when the address decoder 1306*b* is not outputting a memory access request signal 1307*b* to the bus arbiter 1304 or the CPU 1301*b* is in access to any of the memories 1302*b*, . . . , 1302*z*. On the contrary, when the CPU 1301*b* is in access to the memory 1302*a*, because it is a state where the bi-directional bus gate control signals 1310*a*, . . . , 1310*y* are output to close the bi-directional gates 1309*a*, . . . , 1309*y*, the bus arbiter 1304 does not allow the CPU 1301*a* to access the memory and it allows the CPU 1301*b* to access the memory after the access of the CPU 1301*b* is completed.

In this embodiment, the combination on which the both CPUs can perform a simultaneous access is as represented in table 2.

TABLE 2

|  |  | CPU 1a | | | | | | |
|---|---|---|---|---|---|---|---|---|
|  |  | memory 2a | memory 2b | memory 2c | memory 2d | . . . | memory 2y | memory 2z |
| CPU 1b | memory 2a | X | X | X | X | . . . | X | X |
|  | memory 2b | O | X | X | X | . . . | X | X |
|  | memory 2c | O | O | X | X | . . . | X | X |
|  | memory 2d | O | O | O | X | . . . | X | X |
|  | . | . | . | . | . | | . | . |
|  | . | . | . | . | . | | . | . |
|  | memory 2y | O | O | O | O | . . . | X | X |
|  | memory 2z | O | O | O | O | . . . | O | X |

O: simultaneous access is possible
X: simultaneous access is impossible

As described above, according to this embodiment, in a case where two CPUs and three or more memories are connected to a single CPU bus, bi-directional bus gates are provided between respective memories connected to the CPU bus, and the CPU bus is divided into portions corresponding to respective memory units. Therefore, in a state where one CPU is in access to a memory, the other CPU can access any memory which is closer thereto than to the one CPU, and reduction in the processing ability per unit time can be suppressed to a great extent.

What is claimed is:

1. An information processing apparatus comprising:
   a central processing unit;
   a first memory and a second memory;
   a single CPU bus to which said first memory and said second memory are connected for transferring a memory address and a writing/reading control signal which are output from said central processing unit for operation of said first and second memories as duplex memories;
   means for controlling writing/reading to said first memory and said second memory, for decoding said memory address and said writing/reading control signal to set both of said first memory and said second memory in a state enabling the simultaneous writing of data in both of said first and second memories or to set only one of said first memory and said second memory in a state enabling reading.

2. The information processing apparatus of claim 1, comprising:
   the memory addresses output from said CPU being different addresses for said first memory and for said second memory;
   said writing/reading means performing a control of making both of said first memory and said second memory in a state enabling writing when said memory address belongs to a first address region and said writing/reading control signal indicates writing;
   making said first memory in a state enabling reading when said memory address belongs to the first address region and said writing/reading control signal indicates reading; and making said second memory in a state enabling reading when said memory address belongs to a second address region and said writing/reading control signal indicates reading.

3. The information processing apparatus of claim 1, comprising:

the memory addresses output from said CPU being the same addresses for said first memory and for said second memory;

said central processing unit outputting a bank designating signal designating either of said first memory and said second memory in addition to the memory address and the writing/reading control signal;

said writing/reading means performing a control of:
making both of said first memory and said second memory in a state enabling writing when said writing/reading control signal indicates writing;
making said first memory in a state enabling reading when said bank designating signal designates said first memory and said writing/reading control signal indicates reading; and
making said second memory in a state enabling reading when said bank designating signal designates said second memory address and said writing/reading control signal indicates reading.

4. An information processing apparatus comprising:

a first CPU card and a second CPU card forming first and second systems, respectively, each CPU card including a CPU, a memory, and a data bus connecting said CPU and said memory, respectively;

a single inter-system data bus connecting said first CPU card to said second CPU card;

first gate means and second gate means for connecting/disconnecting said inter-system data bus and one of said first data bus and said second data bus, respectively;

gate controlling means respectively included in said first CPU card and said second CPU card, respectively, for decoding the address output from said first CPU and said second CPU, respectively, and to set said first gate means and said second gate means in closed states when the decoded result indicates that writing of data is to be performed by either of said first CPU and said second CPU into both of said first memory and said second memory;

to set said first gate means and said second gate means in closed states when the decoded result indicates that reading of data is to be performed by either of said first CPU and said second CPU into the memory of the other CPU card; and to set said first gate means and said second gate means in open states when the decoded result indicates that reading of data is to be performed by at least either one of said first CPU and said second CPU reads data from the memory of the CPU card of the CPU performing the reading;

writing/reading control means included in said first CPU card and said second CPU card, respectively, for decoding the address output from said first CPU and said second CPU, respectively, and to set both of said first memory and said second memory in states enabling writing when the decoded result indicates that writing of data is to be performed by either of said first CPU and said second CPU into both of said first memory and said second memory;

to set said memory of the CPU card of the CPU not performing reading in a state enabling reading when the decoded result indicates that reading of data is to be performed by either of said first CPU and said second CPU into the memory of the CPU card of the CPU not performing the reading; and to set the memory of the CPU card of the CPU performing reading in a state enabling reading when the decoded result indicates that reading of data is to be performed by at least either one of said first CPU and said second CPU from the memory of the CPU card of the CPU performing reading;

to set only one of said first memory and said second memory in a state enabling reading.

5. The information processing apparatus of claim 4 comprising:

said first memory and said second memory, respectively, having a first address region for performing duplex-writing and reading from the system containing said memory and a second address region for performing address reading from the system not containing said memory;

said first CPU and said second CPU outputting a writing/reading control signal in addition to the memory address;

said gate controlling means setting said first gate means and said second gate means in closed states and said writing/reading control means setting both of said first memory and said second memory in states enabling writing when the memory address output from either of said first CPU and said second CPU belongs to said first address region and said writing/reading control signal output from either of said first CPU and said second CPU indicates writing;

said gate controlling means setting said first gate means and said second gate means in open states and said reading/writing control means setting only the memory of the system containing said memory in a state enabling reading when the memory address output from either of said first CPU and said second CPU belongs to said first address region and said reading/writing control means indicates reading;

said gate controlling means setting the first gate means and the second gate means in closed states and the reading/writing control means setting only the memory of the system not containing said memory in a state enabling reading when the memory address belongs to the second address region and the writing/reading control means indicates reading.

6. The information processing apparatus of claim 4 wherein:

the first memory and the second memory have the same address regions which are divided into first, second, and third address regions;

the gate controlling means sets the first gates means and the second gate means in a closed states and the writing/reading control means sets the memories of both CPU cards in states enabling writing when the memory address belongs to the first address region;

the gate controlling means sets at least the self system gate means in open states and the writing/reading means sets only the memory of its own system card in a state for reading when the memory address belongs to the second address region; and the gate controlling means sets both of the first gate means and the second gate means in closed states and the writing/reading means set only the memory of the other system CPU card in a state for reading when the memory address belongs to the third address region.

7. An information processing apparatus comprising:

a first CPU and a second CPU;

a single CPU bus gate connecting said first CPU and said second CPU;

a first bus and a second bus gate connecting or disconnecting each of the first CPU and the second CPU, and the single bus, respectively;

a first memory and a second memory connected to the single CPU bus for operation as duplex memories, said memories having different addresses;

a gate means provided between the connection node of the first memory and the CPU bus and the connection node of the second memory and the CPU bus;

an access control means for controlling the gate means so that the gate means is in an open state when either of the first CPU and the second CPU outputs an address of the memory of the CPU that outputs the address itself.

8. The information processing apparatus of claim 7 comprising:

said gate means including a bi-directional gate connected between two connection nodes of said single CPU bus and said two memories, respectively;

said access control means including a first address decoder and a second address decoder decoding the addresses output from the first CPU and the second CPU, respectively and a bus arbiter performing open/close control of said first bus gate, the second bus gate, and the bi-directional bus gate in accordance with the decoder outputs of the address decoders.

9. An information processing apparatus comprising:

a first CPU and a second CPU;

a single CPU bus connecting between the first CPU and the second CPU;

a plurality of memories connected to the single CPU bus for operation as duplex memories;

a plurality of gate means connected between the connection nodes of the CPU bus with the plurality of memories;

an access control means for controlling, when either of said first CPU and said second CPU outputs an address of a required one among said plurality of memories, the gate means so that only the gate means connected between the selected memory and the memory that is closest to the selected memory at the side of the other CPU, is in an open state and all the other gate means are in closed states.

10. The information processing apparatus of claim 9 comprising:

first to n-th memories being provided as said memories;

(n−1) pieces of gate means being provided, as said plurality of gate means, which are connected between n pieces of connection nodes connecting the CPU bus with said n pieces of memories;

an access control means comprising a first address decoder and a second address decoder decoding the addresses which are output from said first CPU and said second CPU, respectively, and a bus arbiter for performing an open/close control of said first bus gate and said second bus gate, and (n−1) pieces of bi-directional bus gates in accordance with the decoder outputs of said first and second address decoders.

* * * * *